United States Patent
Wu et al.

(10) Patent No.: US 10,193,023 B2
(45) Date of Patent: Jan. 29, 2019

(54) LIGHT-EMITTING DIODE CHIP

(71) Applicant: PlayNitride Inc., Tainan (TW)

(72) Inventors: Jyun-De Wu, Tainan (TW); Yu-Yun Lo, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/453,335

(22) Filed: Mar. 8, 2017

(65) Prior Publication Data

US 2018/0166609 A1  Jun. 14, 2018

(30) Foreign Application Priority Data

Dec. 8, 2016  (TW) .............. 105140655 A

(51) Int. Cl.
| | |
|---|---|
| H01L 33/38 | (2010.01) |
| H01L 33/14 | (2010.01) |
| H01L 33/30 | (2010.01) |
| H01L 33/06 | (2010.01) |

(52) U.S. Cl.
CPC .............. H01L 33/38 (2013.01); H01L 33/06 (2013.01); H01L 33/14 (2013.01); H01L 33/305 (2013.01)

(58) Field of Classification Search
CPC ..... H01L 33/06; H01L 33/0025; H01L 33/08; H01L 33/30; H01L 31/0735; H01L 21/02505; H01L 2933/0016; H01L 25/167; H01L 2924/12041; H01L 33/38; H01L 33/14; H01L 33/405
See application file for complete search history.

(56) References Cited

U.S. PATENT DOCUMENTS

| | | | | |
|---|---|---|---|---|
| 5,815,522 A | * | 9/1998 | Nagai ................... | H01S 5/162 372/45.01 |
| 5,818,078 A | * | 10/1998 | Makiyama .......... | H01L 21/8252 257/280 |
| 5,991,318 A | * | 11/1999 | Caprara ................. | H01S 5/041 372/105 |

(Continued)

FOREIGN PATENT DOCUMENTS

| | | |
|---|---|---|
| TW | M1260003 | 3/2005 |
| TW | 201620151 | 6/2016 |

OTHER PUBLICATIONS

"Office Action of Taiwan Counterpart Application," dated Jun. 16, 2017, p. 1-p. 5.

*Primary Examiner* — Caridad Everhart
(74) *Attorney, Agent, or Firm* — J.C. Patents

(57) ABSTRACT

A light-emitting diode chip including a p-type semiconductor layer, a light-emitting layer, an n-type semiconductor layer, and a first metal electrode is provided. The light-emitting layer is disposed between the p-type semiconductor layer and the n-type semiconductor layer. The n-type semiconductor layer includes a first n-type semiconductor sub-layer, a second n-type semiconductor sub-layer, and an ohmic contact layer. The ohmic contact layer is disposed between the first n-type semiconductor sub-layer and the second n-type semiconductor sub-layer. The first metal electrode is disposed on the first n-type semiconductor sub-layer. A region of the first n-type semiconductor sub-layer located between the first metal electrode and the ohmic contact layer contains metal atoms diffusing from the first metal electrode, so as to form ohmic contact between the first metal electrode and the ohmic contact layer.

11 Claims, 3 Drawing Sheets

(56) References Cited

U.S. PATENT DOCUMENTS

| | | | | |
|---|---|---|---|---|
| 6,693,352 B1* | 2/2004 | Huang | ............... | H01L 29/452 257/743 |
| 6,958,494 B2* | 10/2005 | Lin | ............... | H01L 33/42 257/103 |
| 2005/0035354 A1* | 2/2005 | Lin | ............... | H01L 33/42 257/79 |
| 2010/0302662 A1* | 12/2010 | Toba | ............... | G11B 5/3116 360/31 |
| 2011/0193119 A1* | 8/2011 | Chen | ............... | H01L 33/46 257/98 |
| 2011/0227111 A1* | 9/2011 | Choi | ............... | H01L 33/405 257/98 |

* cited by examiner

LIGHT-EMITTING DIODE CHIP

CROSS-REFERENCE TO RELATED APPLICATION

This application claims the priority benefit of Taiwan application serial no. 105140655, filed on Dec. 8, 2016. The entirety of the above-mentioned patent application is hereby incorporated by reference herein and made a part of this specification.

FIELD OF THE INVENTION

The invention relates to a light-emitting device. More specifically, the invention relates to a light-emitting diode (LED) chip.

DESCRIPTION OF RELATED ART

With progress in photoelectric technologies, conventional incandescent light bulbs and fluorescent tubes have been gradually replaced by a new generation of solid-state light sources, for example, a light-emitting diode (LED). Since the LED is equipped with advantages such as long lifetime, compactness, high shock resistance, high optical efficiency, low power consumption, and so forth, the LED has been widely used as a light source in home lighting and in a variety of equipment. In addition to backlight modules used in liquid crystal displays and home lighting and lamps that have extensively adopted the LED as the light source, in recent years, LED applications have been expanded to roadway lighting, large outdoor billboards, traffic signal lamps, UV curing, and other related fields. The LED has thus become a major light source providing both energy-saving and environmental protection functions.

In the field of the LED, a new technology, known as a micro-LED, has been developed to significantly reduce a size of an LED chip. When the new technology is applied in the display technology field, red, blue, and green micro-LED chips are used as display sub-pixels, and the display technology of arranging these numerous micro-LED chips that are able to emit lights independently into a display screen is the so-called micro-LED display technology.

Taking a large-sized red LED chip for example, the gallium arsenide layer located at a side of its n-type semiconductor layer serves as an ohmic contact layer for enhancing electrical conductivity of electrodes. However, a thickness of the n-type semiconductor layer, including the gallium arsenide layer, is excessively large in most cases, leading to light absorption and relatively poor efficiency of electrical conductivity as a result. Nevertheless, if the size of the red LED chip is reduced to the size of the micro-LED, problems of the light absorption and the poor efficiency of electrical conductivity in the n-type semiconductor layer become even more evident, and a light output efficiency of the micro-LED is further lowered considerably.

SUMMARY OF THE INVENTION

The invention provides a light-emitting diode (LED) chip with a high light output efficiency.

An embodiment of the invention provides an LED chip including a p-type semiconductor layer, a light-emitting layer, an n-type semiconductor layer, and a first metal electrode. The light-emitting layer is disposed between the p-type semiconductor layer and the n-type semiconductor layer. The n-type semiconductor layer includes a first n-type semiconductor sub-layer, a second n-type semiconductor sub-layer, and an ohmic contact layer. The ohmic contact layer is disposed between the first n-type semiconductor sub-layer and the second n-type semiconductor sub-layer. A first metal electrode is disposed on the first n-type semiconductor sub-layer. A region of the first n-type semiconductor sub-layer located between the first metal electrode and the ohmic contact layer contains metal atoms diffusing from the first metal electrode, and thereby ohmic contact is formed between the first metal electrode and the ohmic contact layer.

In the LED chip provided in the embodiments of the invention, the region of the first n-type semiconductor sub-layer located between the first metal electrode and the ohmic contact layer contains the metal atoms diffusing from the first metal electrode, and thereby ohmic contact is formed between the first metal electrode and the ohmic contact layer. Thus, according to the embodiments of the invention, the thickness of the semiconductor layer may be effectively reduced to reduce light absorption and ensure better efficiency of electrical conductivity. As a result, the LED chip provided in the embodiments of the invention is equipped with high light output efficiency.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

DESCRIPTION OF THE EMBODIMENTS

Figure 1A:
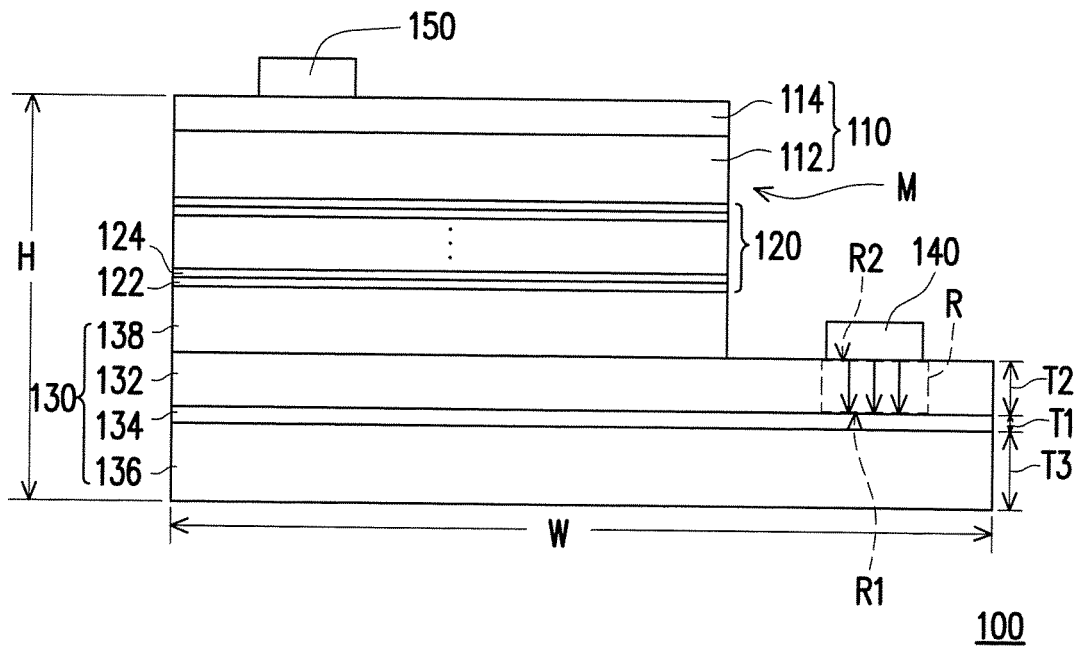
FIG. 1A is a schematic cross-sectional view of an LED chip according to an embodiment of the invention.
Figure 1B:
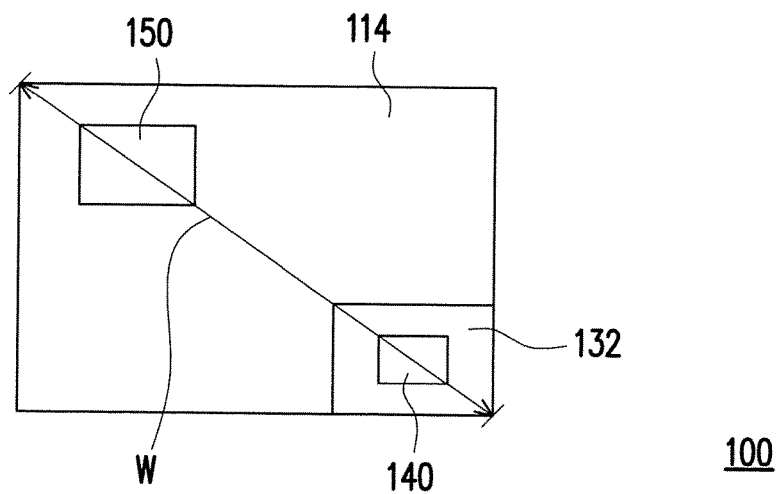
FIG. 1B is a top view of the LED chip in FIG. 1A.

FIG. 1A is a schematic cross-sectional view of an LED chip according to an embodiment of the invention, and FIG. 1B is a top view of the LED chip in FIG. 1A. Referring to FIG. 1A and FIG. 1B, an LED chip 100 in the embodiment includes a p-type semiconductor layer 110, a light-emitting layer 120, an n-type semiconductor layer 130, and a first metal electrode 140. Here, the light-emitting layer 120 is configured to emit a red light and is disposed between the p-type semiconductor layer 110 and the n-type semiconductor layer 130. In the embodiment, the light-emitting layer 120 is, for example, a multiple quantum well, and the light-emitting layer 120 includes an energy barrier layer 122 and an energy well layer 124 stacked alternately. According to the embodiment, the energy barrier layer 122 and the energy well layer 124 are both, for example, aluminum gallium indium phosphide layers, but a mole percentage of aluminum and gallium contained in the energy barrier layer 122 is different from a mole percentage of aluminum and gallium contained in the energy well layer 124. In the embodiment, a chemical formula of a material of the energy barrier layer 122 is, for example, $(Al_xGa_{1-x})_{0.5}In_{0.5}P$, and a chemical formula of a material of the energy well layer 124 is, for example, $(Al_yGa_{1-y})_{0.5}In_{0.5}P$, wherein $0<x<1$ and $0<y<1$.

The n-type semiconductor layer 130 includes a first n-type semiconductor sub-layer 132, a second n-type semiconductor sub-layer 136, and an ohmic contact layer 134. The ohmic contact layer 134 is disposed between the first n-type semiconductor sub-layer 132 and the second n-type semiconductor sub-layer 136. For example, a material of the first n-type semiconductor sub-layer 132 is, for example, silicon-doped $(Al_zGa_{1-z})_{0.5}In_{0.5}P$, and a material of the second n-type semiconductor sub-layer 136 is, for example, silicon-doped $(Al_aGa_{1-a})_{0.5}In_{0.5}P$, wherein $0<z\leq1$ and $0<a\leq1$. In the embodiment, the material of the first n-type semiconductor sub-layer 132 and the second n-type semiconductor sub-layer 136 is, for example, aluminum gallium indium phosphide. In addition, in the embodiment, a material of the ohmic contact layer 134 is n-type gallium arsenide (GaAs), for example, a silicon-doped n-type GaAs layer. Preferably, a thickness T1 of the ohmic contact layer 134 is smaller than or equal to 60 nanometers, and a thickness T2 of the first n-type semiconductor sub-layer 132 and a thickness T3 of the second n-type semiconductor sub-layer 136 are both smaller than or equal to 1.3 microns, such that a light absorption amount of a light emitted by the light-emitting layer 120 and absorbed by the ohmic contact layer 134, the first n-type semiconductor sub-layer 132, and the second n-type semiconductor layer sub-layer 136 may be effectively reduced.

The first metal electrode 140 is disposed on the first n-type semiconductor sub-layer 132. A region R of the first n-type semiconductor sub-layer 132 located between the first metal electrode 140 and the ohmic contact layer 134 contains metal atoms diffusing from the first metal electrode 140, and thereby ohmic contact is formed between the first metal electrode 140 and the ohmic contact layer 134. Since the ohmic contact layer 134 is a GaAs layer with a relatively small band gap, the LED chip 100 is equipped with better efficiency of electrical conductivity by forming a better ohmic contact through the diffusion of the metal atoms between the first metal electrode 140 and the ohmic contact layer 134. Moreover, a buffer layer (not shown), the n-type semiconductor layer 130, the light-emitting layer 120, and the p-type semiconductor layer 110 are formed on a growth substrate (not shown) before the LED chip 100 is formed, and then the growth substrate (not shown) and the buffer layer (not shown) are removed through, for example, an etching process, so as to form the LED chip 100. Since the thickness of the ohmic contact layer 134 is relatively small, the second n-type semiconductor sub-layer 136 may serve as a protection buffer layer of the ohmic contact layer 134 during the etching process to prevent the ohmic contact layer 134 acting as the ohmic contact from being damaged. The ohmic contact is then formed between the first metal electrode 140 and the ohmic contact layer 134 through the metal atoms diffusing from the first metal electrode 140. In addition, a surface of the second n-type semiconductor sub-layer 136 may also be coarsened during the manufacturing process for enhancing light output. Here, the metal atoms at a side R1 of the region R close to the ohmic contact layer 134 has a concentration less than a concentration of the metal atoms at a side R2 of the region R distant from the ohmic contact layer 134. In the manufacturing process, the first metal electrode 140 may be formed on the first n-type semiconductor sub-layer 132, and then the metal atoms in the first metal electrode 140 diffuse to the region R through high-temperature heating (e.g., a temperature of the manufacturing process may fall in a range from 300° C. to 500° C.), so as to form ohmic contact between the first metal electrode 140 and the ohmic contact layer 134, as shown in FIG. 1A. Furthermore, the first n-type semiconductor sub-layer 132, the contact layer 134, and the second n-type semiconductor sub-layer 136 all contain the metal atoms diffusing from the first metal electrode 140, so as to ensure better efficiency of electrical conductivity between the first metal electrode 140 and the ohmic contact layer 134. In the embodiment, a material of the first metal electrode 140 is, for example, gold, germanium, nickel, or an alloy of any combination of the foregoing materials.

In the embodiment, the n-type semiconductor layer 130 further includes an n-type cladding layer 138 disposed between the ohmic contact layer 134 and the light-emitting layer 120. A material of the n-type cladding layer 138 is $(Al_bGa_{1-b})_{0.5}In_{0.5}P$, wherein $0<b\leq1$. Here, the n-type cladding layer 138 is silicon-doped aluminum gallium indium phosphide, for instance, but the invention is not limited thereto. According to the embodiment, the n-type cladding layer 138 is disposed between the first n-type semiconductor sub-layer 132 and the light-emitting layer 120, and the first n-type semiconductor sub-layer 132 is disposed between the n-type cladding layer 138 and the ohmic contact layer 134.

In the embodiment, the p-type semiconductor layer 110 includes a p-type cladding layer 112, and a material of the p-type cladding layer 112 is aluminum indium phosphide, for example, magnesium-doped $Al_{0.5}In_{0.5}P$. In addition, in the embodiment, the LED chip 100 further includes a second metal electrode 150, wherein the p-type semiconductor layer 110 further includes a carbon-doped p-type contact layer 114 disposed between the p-type cladding layer 112 and the second metal electrode 150. In the embodiment, the p-type cladding layer 112 is disposed between the p-type contact layer 114 and the light-emitting layer 120. A material of the p-type contact layer 114 is, for example, a carbon-doped p-type gallium phosphide layer, and a thickness of the p-type contact layer 114 is smaller than or equal to 1 micron, such that the p-type contact layer 114 is slimmed and has favorable electrical conductivity. Particularly, a ratio obtained by dividing a thickness of the p-type semiconductor layer 110 by a total thickness of all semiconductor layers in the LED chip 100 falls in a range from 0.05 to 0.2. Moreover, the carbon-doped p-type contact layer 114 has favorable electrical propagation, so that the LED chip 100 is slimmed and has satisfactory light output efficiency. In the embodiment, a material of the second metal electrode 150 is, for example, gold, germanium, nickel, or an alloy of any combination of the foregoing materials.

According to the embodiment, as shown in FIG. 1B, a ratio obtained by dividing a total thickness H of all semiconductor layers in the LED chip 100 by a maximum width W of the LED chip 100 falls in a range from 0.2 to 1.5, indicating that a size of the LED chip 100 may be relatively small, for example, as small as a size of a micro-LED. In an embodiment, the maximum width W falls in a range, for example, from 1 micron to 100 microns. Compared to other known LED chips, the LED chip provided herein may have a smaller size.

In the LED chip 100 provided in the embodiment, the region R of the first n-type semiconductor sub-layer 132 located between the first metal electrode 140 and the ohmic contact layer 134 contains the metal atoms diffusing from the first metal electrode 140, and thereby the ohmic contact is formed between the first metal electrode 140 and the ohmic contact layer 134. Therefore, the LED chip 100 in the embodiments of the invention has the higher light output efficiency, and the advantage of the higher light output efficiency is even more noticeable when the LED chip 100 has a smaller size (e.g., a micro-LED size).

In addition, in the LED chip 100 provided in the embodiment, the p-type semiconductor layer 110 is located in a protruding mesa region M on the chip, and based on such a configuration, a configuration of a red LED chip (i.e., the LED chip 100) and configurations of blue and green LED chips (with their p-type semiconductor layers generally located in the mesa region) are consistent. Therefore, the manufacturing process of the micro-LED display becomes relatively simple, and manufacturing costs are further reduced effectively.

Figure 2A:
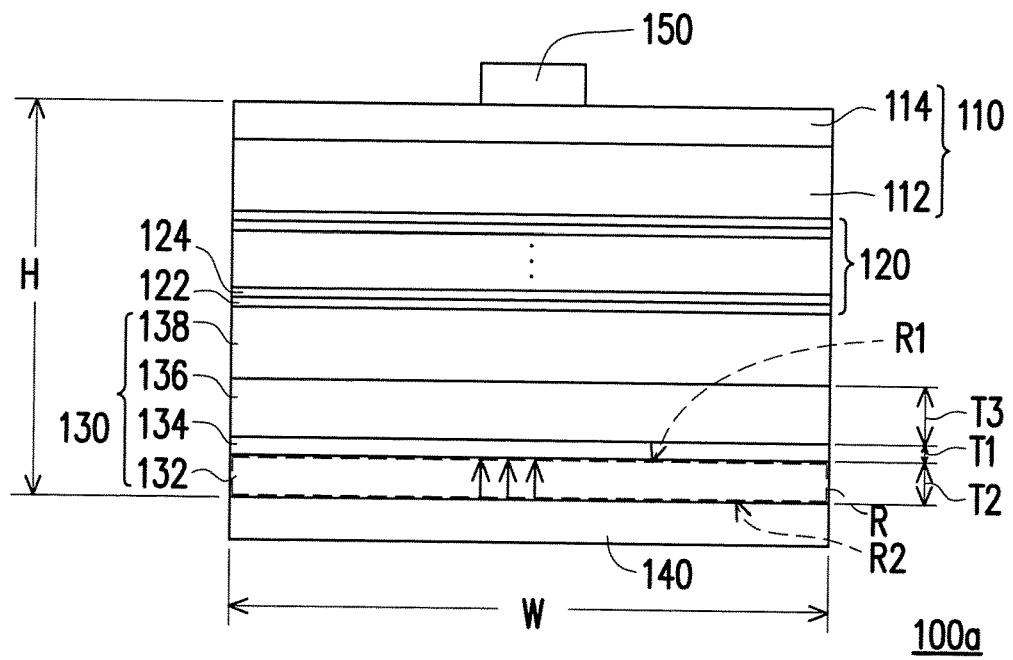
FIG. 2A is a schematic cross-sectional view of an LED chip according to another embodiment of the invention.
Figure 2B:
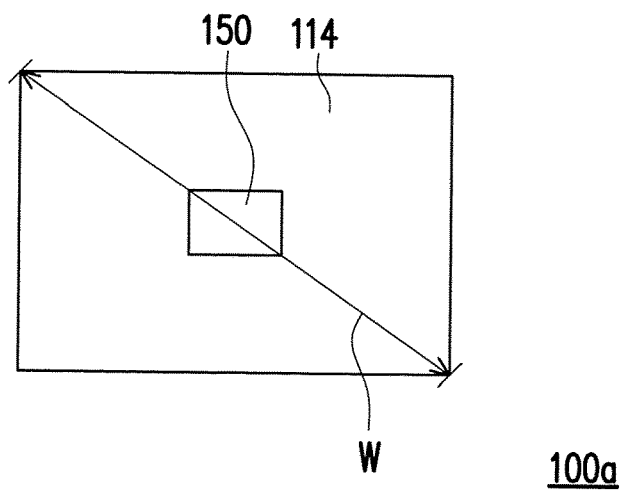
FIG. 2B is a schematic top view of the LED chip in FIG. 2A.

FIG. 2A is a schematic cross-sectional view of an LED chip according to another embodiment of the invention, and FIG. 2B is a schematic top view of the LED chip in FIG. 2A. An LED chip 100a in the embodiment is similar to the LED chip 100 in FIG. 1A, and main differences therebetween are described as follows. In FIG. 1A, the first metal electrode 140 and the second metal electrode 150 are both disposed at the same side of the LED chip 100, but in the embodiment, the first metal electrode 140 and the second metal electrode 150 are disposed on opposite sides of the LED chip 100a. In other words, the LED chip 100 in FIG. 1A is a horizontal LED chip, and the LED chip 100a in FIG. 2A is a vertical LED chip. In addition, in the embodiment, the n-type cladding layer 138 of an n-type semiconductor layer 130a is disposed between the second n-type semiconductor sub-layer 136 and the light-emitting layer 120, and the second n-type semiconductor sub-layer 136 is disposed between n-type cladding layer 138 and the ohmic contact layer 134. In the embodiment, as shown in FIG. 2B, a ratio obtained by dividing the total thickness H of all semiconductor layers in the LED chip 100 by the maximum width W of the LED chip 100 falls in the range from 0.2 to 1.5, indicating that the size of the LED chip 100 may be relatively small. Furthermore, the first n-type semiconductor sub-layer 132 may serve as the protection buffer layer of the ohmic contact layer 134 during the etching process, so as to prevent the ohmic contact layer 134 acting as the ohmic contact from being damaged.

Figure 3:
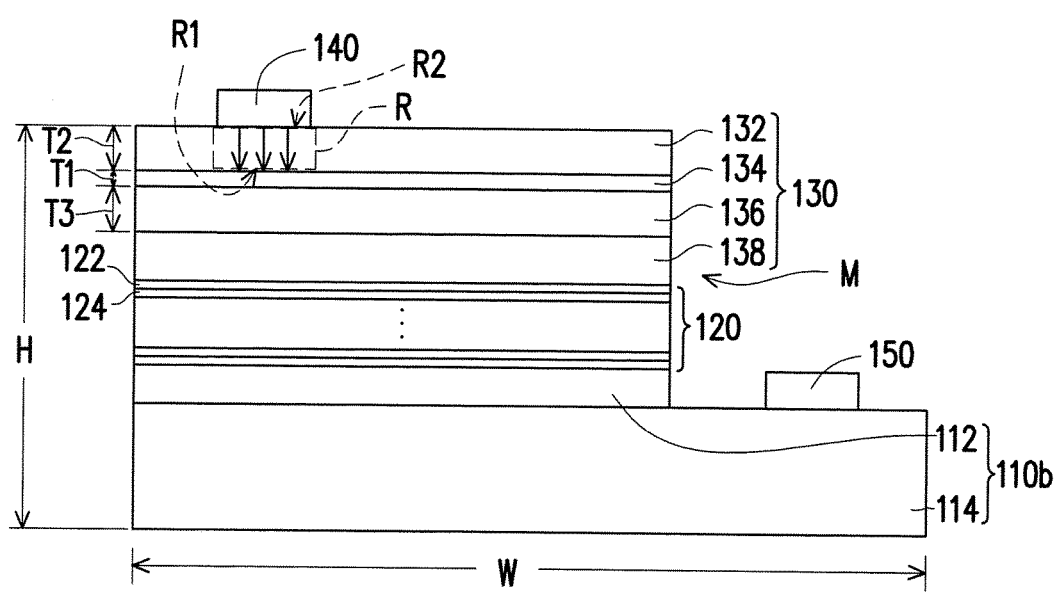
FIG. 3 is a schematic cross-sectional view of an LED chip according to still another embodiment of the invention.

FIG. 3 is a schematic cross-sectional view of an LED chip according to still another embodiment of the invention. Referring to FIG. 3, an LED chip 100b in the embodiment is similar to the LED chip 100 in FIG. 1A, and main differences therebetween are described as follows. In the LED chip 100 in FIG. 1A, the p-type semiconductor layer 110 is located in the protruding mesa region M on the chip, but in the LED chip 100b in the embodiment, it is the n-type semiconductor layer 130 located in the protruding mesa region M on the chip. In addition, the second metal electrode 150 may be disposed on the p-type contact layer 114 of the p-type semiconductor layer 110b.

In view of the foregoing, in the LED chip in embodiments of the invention, the region of the first n-type semiconductor sub-layer located between the first metal electrode and the ohmic contact layer contains the metal atoms diffusing from the first metal electrode, and thereby the ohmic contact is formed between the first metal electrode and the ohmic contact layer. Thus, according to the embodiments of the invention, the thickness of the semiconductor layer may be effectively reduced to reduce light absorption and ensure better efficiency of electrical conductivity. As a result, the LED chip provided in the embodiments of the invention is equipped with high light output efficiency.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A light-emitting diode chip, comprising:
    a p-type semiconductor layer;
    a light-emitting layer;
    an n-type semiconductor layer, the light-emitting layer being disposed between the p-type semiconductor layer and the n-type semiconductor layer, and the n-type semiconductor layer comprising:
    a first n-type semiconductor sub-layer;
    a second n-type semiconductor sub-layer; and
    an ohmic contact layer, disposed between the first n-type semiconductor sub-layer and the second n-type semiconductor sub-layer, wherein the first n-type semiconductor sub-layer and the second n-type semiconductor sub-layer are separated by the ohmic contact layer; and
    a first metal electrode, disposed on the first n-type semiconductor sub-layer, wherein a region of the first n-type semiconductor sub-layer located between the first metal electrode and the ohmic contact layer contains metal atoms diffusing from the first metal electrode, such that ohmic contact is formed between the first metal electrode and the ohmic contact layer.

2. The light-emitting diode chip as claimed in claim 1, wherein the metal atoms at a side of the region adjacent to the ohmic contact layer has a concentration less than a concentration of the metal atoms at another side of the region distant from the ohmic contact layer.

3. The light-emitting diode chip as claimed in claim 1, wherein a thickness of the ohmic contact layer is smaller than or equal to 60 nanometers.

4. The light-emitting diode chip as claimed in claim 1, wherein the ohmic contact layer is an n-type gallium arsenide layer.

5. The light-emitting diode chip as claimed in claim 1, wherein a material of the first n-type semiconductor sub-layer and the second n-type semiconductor sub-layer is aluminum gallium indium phosphide.

6. The light-emitting diode chip as claimed in claim 1, wherein the n-type semiconductor layer further comprises an n-type cladding layer disposed between the first n-type semiconductor sub-layer and the light-emitting layer, and the first n-type semiconductor sub-layer is disposed between the n-type cladding layer and the ohmic contact layer.

7. The light-emitting diode chip as claimed in claim 1, wherein the n-type semiconductor layer further comprises an n-type cladding layer disposed between the second n-type semiconductor sub-layer and the light-emitting layer, and the second n-type semiconductor sub-layer is disposed between the n-type cladding layer and the ohmic contact layer.

8. The light-emitting diode chip as claimed in claim 1, wherein a ratio obtained by dividing a total thickness of all semiconductor layers in the light-emitting diode chip by a maximum width of the light-emitting diode chip falls in a range from 0.2 to 1.5.

9. The light-emitting diode chip as claimed in claim 1, wherein the first n-type semiconductor sub-layer, the ohmic contact layer, and the second n-type semiconductor sub-layer all contain the metal atoms diffusing from the first metal electrode.

10. The light-emitting diode chip as claimed in claim 1, wherein a ratio obtained by dividing a thickness of the p-type semiconductor layer by a total thickness of all semiconductor layers in the light-emitting diode chip falls in a range from 0.05 to 0.2.

11. The light-emitting diode chip as claimed in claim 10, wherein the p-type semiconductor layer comprises a p-type cladding layer and a carbon-doped p-type contact layer, and the p-type cladding layer is disposed between the p-type contact layer and the light-emitting layer.

* * * * *